United States Patent [19]

Jones et al.

[11] Patent Number: 4,588,667

[45] Date of Patent: May 13, 1986

[54] ELECTROPHOTOGRAPHIC IMAGING MEMBER AND PROCESS COMPRISING SPUTTERING TITANIUM ON SUBSTRATE

[75] Inventors: Robert N. Jones, Fairport; Robert E. Heeks, Penfield, both of N.Y.

[73] Assignee: Xerox Corporation, Stamford, Conn.

[21] Appl. No.: 610,552

[22] Filed: May 15, 1984

[51] Int. Cl.[4] ...................... C23C 14/34; G03G 15/06; G03G 5/00; G03G 5/04

[52] U.S. Cl. ................................. 430/73; 204/192 R; 204/192 C; 430/128; 430/131

[58] Field of Search .......................... 430/128, 131, 73; 204/192 R, 192 C

[56] References Cited

U.S. PATENT DOCUMENTS

| | | | |
|---|---|---|---|
| 3,201,667 | 12/1965 | Varga | 317/258 |
| 3,484,237 | 12/1969 | Shattuck et al. | 96/1.5 |
| 3,650,737 | 3/1972 | Maissei et al. | 204/192 P X |
| 3,708,291 | 1/1973 | Kinoshita et al. | 430/128 X |
| 3,725,058 | 4/1973 | Hayashi et al. | 96/1.5 |
| 3,837,851 | 9/1974 | Shattuck et al. | 96/1.5 |
| 3,856,548 | 12/1974 | Taylor et al. | 430/131 X |
| 3,880,657 | 4/1975 | Rasch | 96/1.5 |
| 3,895,944 | 7/1975 | Wiedemann et al. | 96/1.5 |
| 3,925,571 | 12/1975 | Esser et al. | 430/131 X |
| 3,926,762 | 12/1975 | Goldstein | 204/192 |
| 4,026,703 | 5/1977 | Hayashi et al. | 96/1.5 |
| 4,048,372 | 9/1977 | Ando et al. | 204/192 P X |
| 4,123,267 | 10/1978 | Dorer | 96/1 PC |
| 4,150,987 | 4/1979 | Anderson et al. | 96/1.5 R |
| 4,233,384 | 11/1980 | Turner et al. | 430/59 |
| 4,265,990 | 5/1981 | Stolka et al. | 430/59 |
| 4,269,919 | 5/1981 | Kuehnle | 204/192 P X |
| 4,286,033 | 8/1981 | Neyhart et al. | 430/58 |
| 4,291,110 | 9/1981 | Lee | 430/59 |
| 4,299,897 | 11/1981 | Stolka et al. | 430/59 |
| 4,306,008 | 12/1981 | Pai et al. | 430/59 |
| 4,307,942 | 12/1981 | Chahroudi | 350/353 |
| 4,322,276 | 3/1982 | Meckel et al. | 204/192 P |
| 4,349,617 | 9/1982 | Kawashiri et al. | 430/59 |
| 4,358,478 | 11/1982 | Fuse et al. | 427/76 |
| 4,370,360 | 1/1983 | Fuse et al. | 427/76 |
| 4,428,812 | 1/1984 | Sproul | 204/192 R |
| 4,439,507 | 3/1984 | Pan et al. | 430/59 |
| 4,464,450 | 8/1984 | Teuscher | 430/59 |
| 4,497,700 | 2/1985 | Groth et al. | 204/192 R |

FOREIGN PATENT DOCUMENTS

| | | | |
|---|---|---|---|
| 2136180 | 3/1973 | Fed. Rep. of Germany | 430/128 |
| 2308070 | 9/1974 | Fed. Rep. of Germany | 430/128 |
| 1003893 | 1/1976 | Japan | 430/131 |
| 1084642 | 7/1976 | Japan | 430/128 |
| 1010331 | 11/1965 | United Kingdom . | |

OTHER PUBLICATIONS

Karlsson et al., "Optical Constants and Spectral Selectivity of Titanium Carbonitrides", Thin Solid Films 87 (1982), 181-187.

Missiano et al., "Co-Sputtered Optical Films", Vacuum, vol. 27, No. 4, pp. 403-406 (1977).

*Primary Examiner*—John E. Kittle
*Assistant Examiner*—Mukund J. Shah
*Attorney, Agent, or Firm*—Peter H. Kondo

[57] ABSTRACT

An electrophotographic imaging member comprising a substrate, a ground plane layer comprising a titanium metal layer contiguous to the substrate, a charge blocking layer contiguous to the titanium layer, a charge generating binder layer and a charge transport layer. This photoreceptor may be prepared by providing a substrate in a vacuum zone, sputtering a layer of titanium metal on the substrate in the absence of oxygen to deposit a titanium metal layer, applying a charge blocking layer, applying a charge generating binder layer and applying a charge charge transport layer. If desired, an adhesive layer may be interposed between the charge blocking layer and the photoconductive insulating layer.

16 Claims, No Drawings

ELECTROPHOTOGRAPHIC IMAGING MEMBER AND PROCESS COMPRISING SPUTTERING TITANIUM ON SUBSTRATE

BACKGROUND OF THE INVENTION

This invention relates in general to electrophotography and more specifically, to an electrophotographic imaging member and process for forming the imaging member.

In the art of electrophotography an electrophotographic plate comprising a photoconductive insulating layer on a conductive layer is imaged by first uniformly electrostatically charging surface of the photoconductive insulating layer. The plate is then exposed to a pattern of activating electromagnetic radiation such as light, which selectively dissipates the charge in the illuminated areas of the photoconductive insulating layer while leaving behind an electrostatic latent image in the non-illuminated areas. This electrostatic latent image may then be developed to form a visible image by depositing finely divided electroscopic toner particles on the surface of the photoconductive insulating layer.

The resulting visible toner image can be transferred to a suitable receiving member such as paper. This imaging process may be repeated many times with reusable photoconductive insulating layers.

As more advanced, higher speed electrophotographic copiers, duplicators and printers were developed, degradation of image quality was encountered during extended cycling. Moreover, complex, highly sophisticated, duplicating and printing systems operating at very high speeds have placed stringent requirements including narrow operating limits on photoreceptors. For example, the ground plane of many modern photoconductive imaging members must be highly flexible and adhere well to supporting substrates, particularly belt type photoreceptors over many thousands of cycles.

One type of ground plane which is gaining increasing popularity for belt type photoreceptors is vacuum deposited aluminum. However, aluminum films are relatively soft and exhibit poor scratch resistance during photoreceptor fabrication processing. In addition, vacuum deposited aluminum exhibits poor optical transmission stability after extended cycling in xerographic imaging systems. This poor optical transmission stability is the result of oxidation of the aluminum ground plane as electric current is passed across the junction between the metal and photoreceptor. The optical transmission degradation is continuous and, for systems utilizing erase lamps on the nonimaging side of the photoconductive web, has necessitated erase intensity adjustment every 20,000 copies over the life of the photoreceptor.

Further, the electrical cyclic stability of an aluminum ground plane in multilayer structured photoreceptors has been found to be unstable when cycled thousands of times. The oxides of aluminum which naturally form on the aluminum metal employed as an electrical blocking layer prevent charge injection during charging of the photoconductive device. If the resistivity of this blocking layer becomes too great, a residual potential will build across the layer as the device is cycled. Since the thickness of the oxide layer on an aluminum ground plane is not stable, the electrical performance characteristics of a composite photoreceptor undergoes changes during electrophotographic cycling. Also, the storage life of many composite photoreceptors utilizing an aluminum ground place can be as brief as one day at high temperatures and humidity due to accelerated oxidation of the metal. The accelerated oxidation of the metal ground plane increases optical transmission, causes copy quality non-uniformity and can ultimately result in loss of electrical grounding capability.

After long-term use in an electrophotographic copying machine, multilayered photoreceptors utilizing the aluminum ground plane have been observed to exhibit a dramatic dark development potential change between the first cycle and second cycle of the machine due to cyclic instability. The magnitude of this effect is dependent upon cyclic age and relatively humidity but may be as large as 350 volts after 50,000 electrical cycles. This effect is related to interaction of the ground plane and photoconductive materials.

Many metals or other materials which are highly oxidatively stable, form a low energy injection barrier to the photoconductive material when utilized as a ground plane in a photoconductive device. A hole blocking layer will not form on these oxidatively stable layers thus rendering these devices non-functional as photoconductive devices.

Thus, there is a continuing need for photoreceptors having ground planes that exhibit improved scratch resistance, greater optical transmission stability, extended electrical cyclic stability, adequate injection barrier characteristics, longer storage life at high temperatures and humidity and stable dark development potential characteristics.

SUMMARY OF THE INVENTION

It is, therefore, an object of the present invention to provide an improved photoresponsive member which overcomes the above-noted disadvantages.

It is yet another object of the present invention to provide an improved electrophotographic member having a ground plane which exhibits greater resistance to scratches.

A further object of the present invention to provide a photoconductive imaging member which exhibits improved optical transmission stability.

It is a further object of the present invention to provide a photoconductive imaging member which exhibits improved electrical cyclic stability.

It is yet another object of the present invention to provide an electrophotographic imaging member which exhibits greater storage life at high temperatures and humidity.

It is a further object of the present invention to provide an electrophotographic imaging member which exhibits improved dark development potential cyclic stability.

The foregoing objects and others are accomplished in accordance with this invention by providing a photoconductive imaging member comprising a substrate, a ground plane layer comprising a titanium metal layer contiguous to the substrate, a charge blocking layer, a charge generation binder layer and a charge transfer layer. This photoreceptor is prepared by providing a substrate, in a vacuum, sputtering a layer of titanium metal on the substrate in the absence of oxygen to deposit a titanium metal layer, applying a charge blocking layer on the titanium metal layer, applying a charge generation binder layer on the blocking layer and applying a charge transfer layer on the charge generation layer.

The titanium layer may be formed by any suitable vacuum depositing technique. Typical vacuum depositing techniques include sputtering, magnetron sputtering, RF sputtering, and the like. Magnetron sputtering of titanium onto a substrate can be effected by a conventional type sputtering module under vacuum conditions in an inert atmosphere such as argon, neon, or nitrogen using a high purity titanium target. The vacuum conditions are not particularly critical. In general, a continuous titanium film can be attained on a suitable substrate, e.g. a polyester web substrate such as Mylar available from E.I. du Pont de Nemours & Co. with magnetron sputtering. It should be understood that vacuum deposition conditions may all be varied in order to obtain the desired titanium thickness. Typical RF sputtering systems such as a modified Materials Research Corporation Model 8620 Sputtering Module on a Welch 3102 Turbomolecular Pump is described in U.S. Pat. No. 3,926,762, the entire disclosure of which is incorporated herein in its entirety. This patent also describes sputtering a thin layer of trigonal selenium onto a substrate which may consist of titanium. This patent does not, however, appear to specifically disclose how the titanium substrate is formed nor any other technique for applying trigonal selenium. Another technique for depositing titanium by sputtering involves the use of planar magnetron cathodes in a vacuum chamber. A titanium metal target plate is placed on a planar magnetron cathode and the sustrate to be coated is transported over the titanium target plate. The cathode and target plate are preferably horizontally positioned perpendicular to the path of substrate travel to ensure that the deposition of target material across the width of the substrate is of uniform thickness. If desired, a plurality of targets and planar magnetron cathodes may be employed to incease throughput, coverage or vary layer composition. Generally, the vacuum chamber is sealed and the ambient atmosphere is evacuated to about $5\times10^{-6}$ mm Hg. This step is immediately followed by flushing the entire chamber with argon at a partial pressure of about $1\times10^{-3}$ mm Hg to remove most residual wall gas impurities. An atmosphere of argon at about $10\times10^{-4}$ mm Hg is introduced into the vacuum chamber in the region of sputtering. Electrical power is then applied to the planar magnetron and translation of the substrate at approximately 3 to about 8 meters per minute is commenced.

After deposition of the titanium metal layer by sputtering, a charge blocking layer is applied thereto. Any suitable charge blocking layer capable of forming an electronic barrier to charge carriers between the adjacent photoconductive layer layer and the underlying titanium layer and which has an electrical resistivity greater than that of titanium oxide may be utilized. The charge blocking layer may be organic or inorganic and may be deposited by any suitable technique. For example, if the charge blocking layer is soluble in a solvent, it may be applied as a solution and the solvent can subsequently be removed by any conventional method such as by drying. Metal oxide forming componds can be deposited in vacuum processes such as by reactive sputtering. For example, a titanium oxide charge blocking layer may be deposited by any suitable sputtering technique such as RF or magnetron sputtering processes described above with reference to the deposition of the titanium layer. The principal difference between depositing titanium metal and titanium oxide layers by sputtering is that a controlled quantity of oxygen is introduced into the vacuum chamber to oxidize the titanium as it is sputtered toward the substrate bearing the titanium metal coating. The titanium oxide layer may be formed in a separate apparatus than that used for depositing the titanium metal layer or it can be deposited in the same apparatus with suitable partitions between the chamber utilized for depositing titanium metal and the chamber utilized for depositing titanium oxide. The titanium oxide layer may be deposited immediately prior to or subsequent to termination of deposition of the pure titanium metal layer. A transition layer between the deposited titanium metal layer and the titanium oxide layer may be formed by simultaneously sputtering the titanium metal and titanium oxide materials near the end of the pure titanium metal deposition step. Since oxygen is present in the chamber employed for sputtering titanium oxide, the pressure in the chamber employed for depositing titanium metal should be at a slightly higher pressure if bleeding of the oxygen from the titanium oxide chamber into the titanium metal chamber is to be prevented.

Planar magnetrons are commercially available and are manufactured by companies such as the Industrial Vacuum Engineering Company, San Mateo, Calif. Leybold-Heraeus, Germany and U.S., and General Engineering, England. Magnetrons generally are operated at about 500 volts and 120 amps and cooled with water circulated at a rate sufficient to limit the water exit temperature to about 43° C. or less.

The use of magnetron sputtering for depositing titanium and titanium oxide layer on a substrate are described, for example, in U.S. Pat. No. 4,322,276 to Meckel et al, the disclosure incorporated herein in its entirety.

If desired, the titanium oxide layer may be formed by other suitable techniques such as in situ on the outer surface of the titanium metal layer previously deposited by sputtering. Oxidation may be effected by corona treatment, glow discharge, and the like.

The substrate may be opaque or substantially transparent and may comprise numerous suitable materials having the required mechanical properties. Accordingly, this substrate may comprise a layer of an electrically non-conductive or conductive material such as an inorganic or an organic composition. As electrically non-conducting materials there may be employed various resins known for this purpose inlcuding polyesters, polycarbonates, polyamides, polyurethanes, and the like. The insulating or conductive substrate may be flexible or rigid and may have any number of many different configurations such as, for example, a plate, a cylindrical drum, a scroll, an endless flexible belt, and the like. Preferably, the insulating substrate is in the form of an endless flexible belt and is comprised of a commercially available biaxially oriented polyester known as Mylar, available from E. I. du Pont de Nemours & Co. or Melinex available from ICI.

The thickness of the substrate layer depends on numerous factors, including economical considerations, and thus this layer may be of substantial thickness, for example, over 200 micrometers, or of minimum thickness less than 50 micrometers, provided there are no adverse affects on the final photoconductive device. In one embodiment, the thickness of this layer ranges from about 65 micrometers to about 150 micrometers, and preferably from about 75 micrometers to about 125 micrometers for optimum flexibility and minimum stretch when cycled around small diameter rollers, e.g. 12 centimeters diameter rollers.

The surface of the substrate layer is preferably cleaned prior to coating to promote greater adhesion of the deposited coating. Cleaning may be effected by exposing the surface of the substrate layer to plasma discharge, ion bombardment and the like.

The conductive layer may vary in thickness over substantially wide ranges depending on the optical transparency desired for the electrophotoconductive member. Accordingly, the titanium metal layer thickness can generally range in thickness of from at least about 50 Angstrom units to many centimeters. When a flexible photoresponsive imaging device is desired, the thickness may be between about 100 Angstrom units to about 750 Angstrom units, and more preferably from about 100 Angstrom units to about 200 Angstrom units for an optimum combination of electrical conductivity and light transmission.

Any suitable blocking layer capable of trapping charge carriers at the interface between the adjacent photoconductive layer layer and the underlying titanium layer and which has an electrical resistivity greater than the titanium oxide layer may be utilized. Typical blocking layers include polyvinylbutyral, organosilanes, epoxy resins, polyesters, polyamides, polyurethanes, pyroxyline vinylidene chloride resin, silicone resins, fluorocarbon resins and the like containing an organo metallic salt. Other blocking layers may include oxides of the metals of Group IV of the Periodic Table. Other blocking layer materials include nitrogen containing siloxanes or nitrogen containing titanium compounds such as trimethoxysilyl propylene diamine, hydrolyzed trimethoxysilyl propyl ethylene diamine, N-beta-(aminoethyl) gamma-amino-propyl trimethoxy silane, isopropyl 4-aminobenzene sulfonyl, di(dodecylbenzene sulfonyl) titanate, isopropyl di(4-aminobenzoyl) isostearoyl titanate, isopropyl tri(N-ethylamino-ethylamino) titanate, isopropyl trianthranil titanate, isopropyl tri(N,N-dimethyl-ethylamino) titanate, titanium-4-amino benzene sulfonat oxyacetate, titanium 4-aminobenzoate isostearate oxyacetate, [H2N(CH2)4]CH3Si(OCH3)2, (gamma-aminobutyl) methyl diethoxysilane, and [H2N(CH2)3]CH3Si(OCH3)2 (gamma-aminopropyl) methyl diethoxysilane, as disclosed in U.S. Pat. No. 4,291,110, The disclosures of U.S. Pat. Nos. 4,338,387, 4,286,033 and 4,291,110 are incorporated herein in their entirety. A prefered blocking layer comprises a reaction product between a hydrolyzed silane and a metal oxide layer of a conductive anode, the hydrolyzed silane having the general formula:

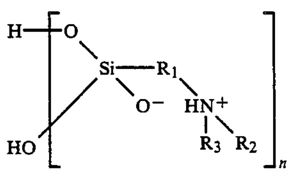

I.

-continued

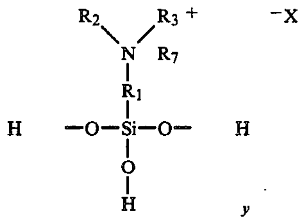

II.

or mixtures thereof, wherein $R_1$ is an alkylidene group containing 1 to 20 carbon atoms, $R_2$, $R_3$ and $R_7$ are independently selected from the group consisting of H, a lower alkyl group containing 1 to 3 carbon atoms and a phenyl group, X is an anion of an acid or acidic salt, n is 1, 2, 3 or 4, and y is 1, 2, 3 or 4. The imaging member is prepared by depositing on the metal oxide layer of a metallic conductive anode layer a coating of an aqueous solution of the hydrolyzed silane at a pH between about 4 and about 10, drying the reaction product layer to form a siloxane film and applying the electrically operative layers to the siloxane film.

The hydrolyzed silane may be prepared by hydrolyzing a silane having the following structural formula:

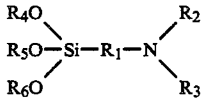

wherein $R_1$ is an alkylidene group containing 1 to 20 carbon atoms, $R_2$ and $R_3$ are independently selected from H, a lower alkyl group containing 1 to 3 carbon atoms, a phenyl group and a poly(ethylene)amino or ethylene diamine group, and $R_4$, $R_5$ and $R_6$ are independently selected from a lower alkyl group containing 1 to 4 carbon atoms. Typical hydrolyzable silanes include 3-aminopropyl triethoxy silane, (N,N'-dimethyl 3-amino) propyl triethoxysilane, N,N-dimethylamino phenyl triethoxy silane, N-phenyl aminopropyl trimethoxy silane, trimethoxy silylpropyldiethylene triamine and mixtures thereof.

If $R_1$ is extended into a long chain, the compound becomes less stable. Silanes in which $R_1$ contains about 3 to about 6 carbon atoms are preferred because the molecule is more stable, is more flexible and is under less strain. Optimum results are achieved when $R_1$ contains 3 carbon atoms. Satisfactory results are achieved when $R_2$ and $R_3$ are alkyl groups. Optimum smooth and uniform films are formed with hydrolyzed silanes in which $R_2$ and $R_3$ are hydrogen. Satisfactory hydrolysis of the silane may be effected when $R_4$, $R_5$ and $R_6$ are alkyl groups containing 1 to 4 carbon atoms. When the alkyl groups exceed 4 carbon atoms, hydrolysis becomes impractically slow. However, hydrolysis of silanes with alkyl groups containing 2 carbon atoms are preferred for best results.

During hydrolysis of the amino silanes described above, the alkoxy groups are replaced with hydroxyl groups. As hydrolysis continues, the hydrolyzed silane takes on the following intermediate general structure:

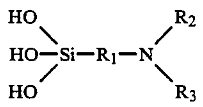

After drying, the siloxane reaction product film formed from the hydrolyzed silane contains larger molecules in which n is equal to or greater than 6. The reaction product of the hydrolyzed silane may be linear, partially crosslinked, a dimer, a trimer, and the like.

The hydrolyzed silane solution may be prepared by adding sufficient water to hydrolyze the alkoxy groups attached to the silicon atom to form a solution. Insufficient water will normally cause the hydrolyzed silane to form an undesirable gel. Generally, dilute solutions are preferred for achieving thin coatings. Satisfactory reaction product films may be achieved with solutions containing from about 0.1 percent by weight to about 1.5 percent by weight of the silane based on the total weight of the solution. A solution containing from about 0.05 percent by weight to about 0.2 percent by weight silane based on the total weight of solution are preferred for stable solutions which form uniform reaction product layers. It is critical that the pH of the solution of hydrolyzed silane be carefully controlled to obtain optimum electrical stability. A solution pH between about 4 and about 10 is preferred. Thick reaction product layers are difficult to form at solution pH greater than about 10. Moreover, the reaction product film flexibility is also adversely affected when utilizing solutions having a pH greater than about 10. Further, hydrolyzed silane solutions having a pH greater than about 10 or less than about 4 tend to severly corrode metallic conductive anode layers such as those containing aluminum during storage of finished photoreceptor products. Optimum reaction product layers are achieved with hydrolyzed silane solutions having a pH between about 7 and about 8, because inhibition of cycling-up and cycling-down characteristics of the resulting treated photoreceptor are maximized. Some tolerable cycling-down has been observed with hydrolyzed amino silane solutions having a pH less than about 4.

Control of the pH of the hydrolyzed silane solution may be effected with any suitable organic or inorganic acid or acidic salt. Typical organic and inorganic acids and acidic salts include acetic acid, citric acid, formic acid, hydrogen iodide, phosphoric acid, ammonium chloride, hydrofluorsilicic acid, Bromocresol Green, Bromophenol Blue, p-toluene sulfonic acid and the like.

If desired, the aqueous solution of hydrolyzed silane may also contain additives such as polar solvents other than water to promote improved wetting of the metal oxide layer of metallic conductive anode layers. Improved wetting ensures greater uniformity of reaction between the hydrolyzed silane and the metal oxide layer. Any suitable polar solvent additive may be employed. Typical polar solvents include methanol, ethanol, isopropanol, tetrahydrofuran, methylcellosolve, ethylcellosolve, ethoxyethanol, ethylacetate, ethylformate and mixtures thereof. Optimum wetting is achieved with ethanol as the polar solvent additive. Generally, the amount of polar solvent added to the hydrolyzed silane solution is less than about 95 percent based on the total weight of the solution.

Any suitable technique may be utilized to apply the hydrolyzed silane solution to the metal oxide layer of a metallic conductive anode layer. Typical application techniques include spraying, dip coating, roll coating, wire wound rod coating, and the like. Although it is preferred that the aqueous solution of hydrolyzed silane be prepared prior to application to the metal oxide layer, one may apply the silane directly to the metal oxide layer and hydrolyze the silane in situ by treating the deposited silane coating with water vapor to form a hydrolyzed silane solution on the surface of the metal oxide layer in the pH range described above. The water vapor may be in the form of steam or humid air. Generally, satisfactory results may be achieved when the reaction product of the hydrolyzed silane and metal oxide layer forms a layer having a thickness between about 20 Angstroms and about 2,000 Angstroms. As the reaction product layer becomes thinner, cycling instability begins to increase. As the thickness of the reaction product layer increases, the reaction product layer becomes more non-conducting and residual charge tends to increase because of trapping of electrons and thicker reaction product films tend to become brittle prior to the point where increases in residual charges become unacceptable. A brittle coating is, of course, not suitable for flexible photoreceptors, particularly in high speed, high volume copiers, duplicators and printers.

Drying or curing of the hydrolyzed silane upon the metal oxide layer should be conducted at a temperature greater than about room temperature to provide a reaction product layer having more uniform electrical properties, more complete conversion of the hydrolyzed silane to siloxanes and less unreacted silanol. Generally, a reaction temperature between about 100° C. and about 150° C. is preferred for maximum stabilization of electrochemical properties. The temperature selected depends to some extent on the specific metal oxide layer utilized and is limited by the temperature sensitivity of the substrate. Reaction product layers having optimum electrochemical stability are obtained when reactions are conducted at temperatures of about 135° C. The reaction temperature may be maintained by any suitable technique such as ovens, forced air ovens, radiant heat lamps, and the like.

The reaction time depends upon the reaction temperatures used. Thus less reaction time is required when higher reaction temperatures are employed. Generally, increasing the reaction time increases the degree of cross-linking of the hydrolyzed silane. Satisfactory results have been achieved with reaction times between about 0.5 minute to about 45 minutes at elevated temperatures. For practical purposes, sufficient cross-linking is achieved by the time the reaction product layer is dry provided that the pH of the aqueous solution is maintained between about 4 and about 10.

The reaction may be conducted under any suitable pressure including atmospheric pressure or in a vacuum. Less heat energy is required when the reaction is conducted at sub-atmospheric pressures.

One may readily determine whether sufficient condensation and cross-linking has occurred to form a siloxane reaction product film having stable electric chemical properties in a machine environment by merely washing the siloxane reaction product film with water, toluene, tetrahydrofuran, methylene chloride or cyclohexanone and examining the washed siloxane reaction product film to compare infrared absorption of Si—O— wavelength bands between about 1,000 to about 1,200 $cm^{-1}$. If the Si—O— wavelength bands are visible, the degree of reaction is sufficient, i.e. sufficient condensation and cross-linking has occurred, if peaks in the bands do not diminish from one infrared absorption test to the next. It is believed that the partially polymerized reaction product contains siloxane and silanol moieties in the same molecule. The expression "partially polymerized" is used because total polymerization is normally not achievable even under the most severe drying or curing conditions. The hydrolyzed silane appears to react with metal hydroxide molecules in the pores of the metal oxide layer. This siloxane coating is described in U.S. Patent Application, Ser. No. 420,962, entitled Multi-layer Photoreceptor Containing Siloxane on a Metal Oxide Layer, filed Sept. 21, filed Sept. 21, 1982 now U.S. Pat. No. 4,464,450 issued Aug. 7, 1984 in the name of Leon A. Teuscher, the disclosure of this application being incoporated herein in its entirety.

The blocking layer should be continuous and have a thickness of less than about 0.5 micrometer because greater thicknesses may lead to undesirably high residual voltage. A blocking layer of between about 0.005 micrometer and about 0.3 micrometer (50 Angstroms-300 Angstroms) is preferred because charge neutralization after the exposure step is facilitated and optimum electrical performance is achieved. A thickness of between about 0.3 micrometer and about 0.05 micrometer is preferred for Ti oxide blocking layers. Optimum results are achieved with a siloxane blocking layer. The blocking layer may be applied by any suitable conventional technique such as spraying, dip coating, draw bar coating, gravure coating, silk screening, air knife coating, reverse roll coating, vacuum deposition, chemical treatment and the like. For convenience in obtaining thin layers, the blocking layers are preferably applied in the form of a dilute solution, with the solvent being removed after deposition of the coating by conventional techniques such as by vacuum, heating and the like. Generally, a weight ratio of blocking layer material and solvent of between about 0.05:100 and about 0.5:100 is satisfactory for spray coating.

In some cases, intermediate layers between the blocking layer and the adjacent generator layer may be desired to improve adhesion or to act as an electrical barrier layer. If such layers are utilized, they preferably have a dry thickness between about 0.1 micron to about 5 microns. Typical adhesive layers include film-forming polymers such as polyester, polyvinylbutyral, polyvinylpyrolidone, polyurethane, polymethyl methacrylate and the like.

Any suitable photoconductive binder layer may be applied to the blocking layer or intermediate layer if one is employed, which can then be overcoated with a contiguous transport layer as described. Examples of photogenerating binder layers include photoconductive particles such as trigonal selenium, various phthalocyanine pigment such as the X-form of metal free phthalocyanine described in U.S. Pat. No. 3,357,989, metal phthalocyanines such as copper phthalocyanine, quinacridones available from DuPont under the tradename Monastral Red, Monastral violet and Monastral Red Y, substituted 2,4-diamino-triazines disclosed in U.S. Pat. No. 3,442,781, polynuclear aromatic quinones available from Allied Chemical Corporation under the tradename Indofast Double Scarlet, Indofast Violet Lake B, Indofast Brilliant Scarlet and Indofast Orange dispersed in a film forming polymeric binder.

Numerous inactive resin materials may be employed in the photogenerating binder layer including those described, for example, in U.S. Pat. No. 3,121,006, the entire disclosure of which is incorporated herein by reference. Typical organic resinous binders include thermoplastic and thermosetting resins such as polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amide-imide), styrene-butadiene copolymers, vinylidenechloride-vinylchloride copolymers, vinylacetate-vinylidenechloride copolymers, styrene-alkyd resins, and the like. These polymers may be block, random or alternating copolymers. Excellent results may be achieved with a resinous binder material comprising a poly(hydroxyether) material selected from the group consisting of those of the following formulas:

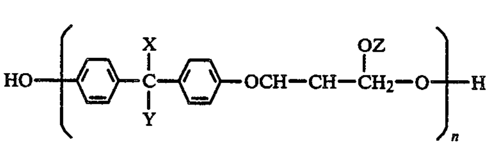
I.

and

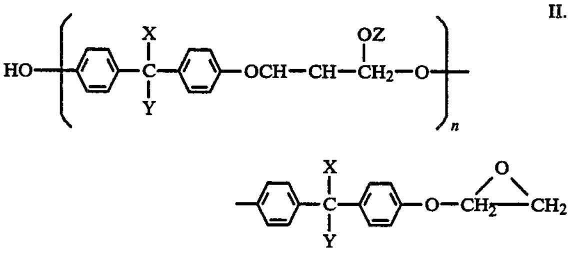
II.

wherein X and Y are independently selected from the group consisting of aliphatic groups and aromatic groups, Z is hydrogen, an aliphatic group or an aromatic group, and n is a number of from about 50 to about 200.

These poly(hydroxyethers), some of which are commercially available from Union Carbide Corporation, are generally described in the literature as phenoxy resins or epoxy resins.

Examples of aliphatic groups for the poly(hydroxyethers), include those containing from about 1 carbon atom to about 30 carbon atoms, such as methy, ethyl, propyl, butyl, pentyl, hexyl, heptyl, decyl, pentadecyl, eicodecyl, and the like. Preferred aliphatic groups include alkyl groups containing from about 1 carbon atom to about 6 carbon atoms, such as methy, ethyl, propyl, and butyl. Illustrative examples of aromatic groups include those containing from about 6 carbon atoms to about 25 carbon atoms, such a phenyl, naphthyl, anthryl, and the like, with phenyl being preferred. The aliphatic and aromatic groups can be substituted with various known substituents, including for example, alkyl, halogen, nitro, sulfo and the like.

Examples of the Z substituent include hydrogen as well as aliphatic aromatic, substituted aliphatic and substituted aromatic groups as defined herein. Furthermore Z can be selected from carboxyl, carbonyl, carbonate, and other similar groups, resulting in for example, the corresponding esters, and carbonates of the poly(hydroxyethers).

Preferred poly(hydroxyethers) include those wherein X and Y are alkyl groups, such as methyl, Z is hydrogen or a carbonate group, and n is a number ranging from about 75 to about 100. Specific preferred poly(hydroxyethers) include Bakelite, phenoxy resins PKHH, commercially available from Union Carbide Corporation and resulting from the reaction of 2,2-bis(4-hydroxyphenylpropane), or bisphenol A, with epichlorohydrin, an epoxy resin, AralditeR 6097, commercially available from CIBA, the phenylcarbonate of the poly(hydroxyethers) wherein Z is a carbonate grouping, which material is commercially available from Allied Chemical Corporation, as well as poly(hydroxyethers) derived from dichloro bis phenol A, tetrachloro bis phenol A, tetrabromo bis phenol A, bis phenol F, bis phenol ACP, bis phenol L, bis phenol V, bis phenol S, and the like and the like.

The photogenerating layer containing photoconductive compositions and/or pigments and the resinous binder material generally ranges in thickness of from about 0.1 micron to about 5.0 microns, and preferably has a thickness of from about 0.3 micron to about 3 micron. Thicknesses outside these ranges can be selected providing the objectives of the present invention are achieved.

The photogenerating composition or pigment is present in the poly(hydroxyethers) resinous binder composition in various amounts, generally, however, from about 10 percent by volume to about 50 percent by volume of the photogenerating pigment is dispersed in about 50 percent by volume to about 90 percent by volume of the poly(hydroxyether) binder, and preferably from about 20 percent by volume to about 30 percent by volume of the photogenerating pigment is dispersed in about 70 percent by volume to about 80 percent by volume of the poly(hydroxyether) binder composition. In one embodiment about 25 percent by volume of the photogenerating pigment is dispersed in about 75 percent by volume of the poly(hydroxyether) binder composition.

Examples of photosensitive members having at least two electrically operative layers include the charge generator layer and diamine containing transport layer members disclosed in U.S. Pat. No. 4,265,990, U.S. Pat. No. 4,233,384, U.S. Pat. No. 4,306,008, U.S. Pat. No. 4,299,897 and U.S. Pat. No. 4,439,507. The disclosures of these patents are incorporated herein in their entirety.

A preferred multilayered photoconductor comprises a charge generation layer comprising a binder layer of photoconductive material and a contiguous charge transport layer of a polycarbonate resin material having a molecular weight of from about 20,000 to about 120,000 having dispersed therein from about 25 to about 75 percent by weight of one or more compounds having the general formula:

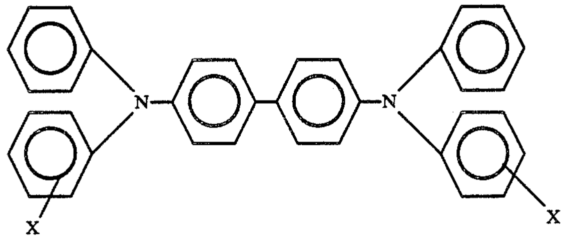

wherein X is selected from the group consisting of an alkyl group, having from 1 to about 4 carbon atoms and chlorine, said photoconductive layer exhibiting the capability of photogeneration of holes and injection of said holes and said charge transport layer being substantially non-absorbing in the spectral region at which the photoconductive layer generates and injects photogenerated holes but being capable of supporting the injection of photogenerated holes from said photoconductive layer and transporting said holes through said charge transport layer. Other examples of charge transport layers capable of supporting the injection of photogenerated holes of a charge generating layer and transporting the holes through the charge transport layer include triphenylmethane, bis(4-diethylamine-2-methylphenyl) phenylmethane; 4'-4''-bis(diethylamino)-2',2''-dimethyltriphenyl methane and the like dispersed in an inactive resin binder.

Generally, the thickness of the transport layer is between about 5 to about 100 microns, but thicknesses outside this range can also be used. The charge transport layer should be an insulator to the extent that the electrostatic charge placed on the charge transport layer is not conducted in the absence of illumination at a rate sufficient to prevent formation and retention of an electrostatic latent image thereon. In general, the ratio of the thickness of the charge transport layer to the charge generator layer is preferably maintained from about 2:1 to 200:1 and in some instances as great as 400:1.

Optionally, an overcoat layer may also be utilized to improve resistance to abrasion. These overcoating layers may comprise organic polymers or inorganic polymers that are electrically insulating or slightly semi-conductive.

The invention will now be described in detail with respect to the specific preferred embodiments thereof, it being understood that these examples are intended to be illustrative only and that the invention is not intended to be limited to the materials, conditions, process parameters and the like recited herein. All parts and percentages are by weight unless otherwise indicated.

EXAMPLE I

A polyester film was vacuum coated with an aluminum layer having a thickness of about 180 Angstroms. The exposed surface of the aluminum layer was oxidized by exposure to oxygen in the ambient atmosphere at elevated temperatures. A siloxane layer was prepared by applying a 0.22 percent (0.001 mole) solution of 3-aminopropyl triethoxylsilane to the oxidized surface of the aluminum layer with a 0.0015 inch Bird applicator. The deposited coating was dried at 135° C. in a forced air oven to form a layer having a thickness of 120 Angstroms. A coating of polyester resin, du Pont 49000, available from E. I. du Pont de Nemours & Co. was applied with a 0.0005 inch Bird applicator to the siloxane coated base. The polyester resin coating was dried to form a film having a thickness of about 0.05 micrometers. A slurry coating solution of 0.8 grams of sodium doped trigonal selenium having a particle size of about 0.05 micrometers to 0.2 micrometers and about 0.8 grams of polyvinylcarbazole in about 7 milliliters of tetrahydrofuran and about 7 milliliters toluene was applied with a Bird applicator to form a layer having a wet thickness of 26 micrometers. The coated member was dried at 135° C. in a forced air oven to form a layer having a thickness of 2.5 micrometers. A charge transport layer was formed on this charge generator layer by applying a mixture of a 50-50 by weight solution of Makrolon, a polycarbonate resin having a molecular weight from about 50,000 to about 100,000 available from Farbenfabriken Bayer A. G., and N,N'-diphenyl-N,N'-bis(3-methylphenyl)-[1,1'-biphenyl]-4,4'-diamine dissolved in methylene chloride to give a 15 percent by weight solution. The components were coated on top of the generator layer with a Bird applicator and dried at temperature of about 80° C. to form a 25 micrometer thick dry layer of hole transporting material. This photoreceptor was then secured to an aluminum cylinder 30 inches in diameter. The drum was rotated at a constant speed of 60 revolutions per minute resulting in a surface speed of 30 inches per second. Charging devices, exposure lights, erase lights, and probes were mounted around the periphery of the cylinder. The locations of the charging devices, exposure lights, erase lights, and probes were adjusted to obtain the following time sequence:

| | |
|---|---|
| Charging | 0.0 second |
| Voltage Probe 1 (V 1) | 0.06 second |
| Expose | 0.16 second |
| Voltage Probe 2 (V 2) | 0.22 second |
| Voltage Probe 4 (V 4) | 0.66 second |
| Erase | 0.72 second |
| Voltage Probe 5 | 0.84 second |
| Start of Next Cycle | 1.00 second |

The photoreceptor was rested in the dark for 15 minutes prior to charging. It was then negatively corona charged in the dark to a high development potential and the voltage measured at Voltage Probe 1 (V1) was −750 v. The photoreceptor was discharged (erased) 720 microseconds after charging by exposure to about 500 erg/cm$^2$ of light. The photoreceptor was completely discharged by the light source in the first and second cycles indicating that it was capable of xerographic use to form visible images. The photoreceptor was then subjected to 50,000 electrical cycles and allowed to rest for about 0.5 hour. Upon resuming the electrical cycling, the dark development potential change (measured at Probe 2 with no exposure) between the first cycle and second cycle of the machine was −350 volts instead of −750 V due to cyclic instability. The entire test was conducted at 40 percent relative humidity.

EXAMPLE II

The procedures of Example I were repeated with the same materials except that instead of being vacuum coated with an aluminum layer, the polyester film was coated by sputtering in the absence of oxygen a titanium metal layer having a thickness of about 200 Angstroms and thereafter depositing on the titanium metal layer. Utilizing the testing procedures of Example I, the photoreceptor was completely discharged by the light source in the first and second cycles indicating that it was capable of xerographic use to form visible images. The photoreceptor was then subjected to 50,000 electrical cycles and allowed to rest for about 0.5 hour. Upon resuming the electrical cycling, the dark development potential change (measured at Probe 6 with no exposure) between the first cycle and second cycle of the machine was negligible indicating excellent cycle stability.

EXAMPLE III

The procedures of Example I were repeated with the same materials except that the cyclic testing was conducted after the photoreceptor was held at 80 percent RH and 30° C. After storage at this relative humidity for about 2 days, the photoreceptor could not be discharged because the entire aluminum layer was oxidized and had became electrically insulating.

EXAMPLE IV

The procedures of Example II were repeated with the same materials except that the cyclic testing was conducted after the photoreceptor was held at 80 percent RH and 30° C. After storage at this relative humidity for about 2 days, the photoreceptor performed in the same manner as the photoreceptor in Example II for 50,000 electrical cycles and the titanium layer remained completely electrically conductive, the optical transmission was unaffected and the photoreceptor discharged adequately.

EXAMPLE V

The procedures of Example I were repeated with the same materials except that the cyclic testing was conducted at 50 percent relative humidity. After 50,000 cycles of electrical cycling, transmission of light having a wavelength between about 500 and about 540 millimicrons through the non-imaging side of the polyester film and through the aluminum and aluminum oxide layers increased from 16 percent to 32 percent. This was an increase of about 100 percent. This large change in light transmission requires machine compensation and is indicative of degradation of the aluminum layer.

EXAMPLE VI

The procedures of Example II were repeated with the same materials except that the cyclic testing was conducted at 50 percent relative humidity. After 50,000 cycles of electrical cycling, transmission of light having a wavelength between about 500 and about 540 millimicrons through the non-imaging side of the polyester film and through the titanium and titanium oxide layers did not increase above the starting transmission of 16%. This stability in light transmission demonstrates an absence of degradation of the Titanium ground plane.

EXAMPLE VII

The procedures of Example I were repeated with the same materials except that prior to applying the blocking layer coating, the oxidized surface of the aluminized polyester film was tested for scratch resistance by incrementally increasing the weight on a stylus traversing the oxidized surface until a scratch is detected by means of a Taly Surf scratch detector from Taylor Hobson Co. The scratch resistance was about 10–20 grams.

EXAMPLE VIII

The procedures of Example II were repeated with same materials except that prior to applying the blocking layer coating, the oxidized surface of the titanium coated polyester film was tested for scratch resistance by incrementally increasing the weight on a stylus traversing the oxidized surface until a scratch is detected by means of a Taly Surf scratch detector from Taylor Hobson Co. The scratch resistance was about 20–40 grams. This increase in scratch resistance has a large economic advantage over EXAMPLE I.

EXAMPLE IX

The procedures of Example II were repeated with the same materials except that the siloxane blocking was omitted. After 10,000 electrical cycles the dark development potential had decreased from −750 volts to −350 volts due to cyclic instability.

EXAMPLE X

The procedures of Example IX were repeated with the same materials except that the titanium ground plane was coated with a titanium oxide blocking layer by magnetron deposition in a partial vacuum in the presence of a slight amount of oxygen. After 50,000 electrical cycles the dark development potential change was negligible indicating excellent cyclic stability.

Although the invention has been described with reference to specific preferred embodiments, it is not intended to be limited thereto, rather those skilled in the art will recognize that variations and modifications may be made therein which are within the spirit of the invention and within the scope of the claims.

What is claimed is:

1. A process for the preparation of an electrophotographic imaging number comprising providing a substrate in a vacuum zone, sputtering titanium on said substrate in the absence of oxygen to deposit a titanium metal layer, applying a blocking layer comprising a siloxane, said siloxane comprising a reaction product of a hydrolyzed silane having the structural formula

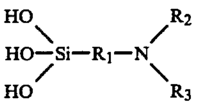

wherein $R_1$ is an alkylidene group containing 1 to 20 carbon atoms and $R_2$ and $R_3$ are independently selected from the group consisting of H, a lower alkyl group containing 1 to 3 carbon atoms, a phenyl group, a poly(ethylene)amino group and an ethylene diamine group, applying a charge generating binder layer and applying a charge transport layer comprising a resin binder and a diamine compound.

2. A process for the preparation of an electrophotographic imaging member according to claim 1 including heating said hydrolyzed silane between about 100° C. and about 150° C. to form said siloxane.

3. A process for the preparation of an electrophotographic imaging member according to claim 1 wherein said blocking layer comprising said siloxane has a thickness of between about 20 Angstroms and about 2,000 Angstroms.

4. A process for the preparation of an electrophotographic imaging member according to claim 1 wherein said sputtering in said vacuum zone is sufficient to deposit a titanium metal layer having a thickness of at least about 50 Angstrom units.

5. A process for the preparation of an electrophotographic imaging member according to claim 2 wherein said siloxane is formed from a hydrolyzed silane solution containing from about 0.1 by weight to about 0.2 percent by weight silane based on the total weight of said solution.

6. A process for the preparation of an electrophotographic imaging member according to claim 1 wherein the combination of said titanium metal layer and said blocking layer transmits at least 15 percent of light having a wavelength between about 400 Angstroms and about 700 Angstroms.

7. A process for the preparation of an electrophotographic imaging member according to claim 1 wherein said charge generating binder layer comprises particles of amorphous selenium, trigonal selenium, and selenium alloys selected from the group consisting of selenium-telurium, selenium-telurium-arsenic and mixtures thereof.

8. A process for the preparation of an electrophotographic imaging member according to claim 1 including depositing on said charge generating binder layer a coating comprising a solution of a polycarbonate resin material having a molecular weight of from about 20,000 to about 120,000 and from about 25 to about 75 percent by weight of said diamine compound based on the total weight of said polycarbonate resin, said diamine compound of one or more compounds having the general formula:

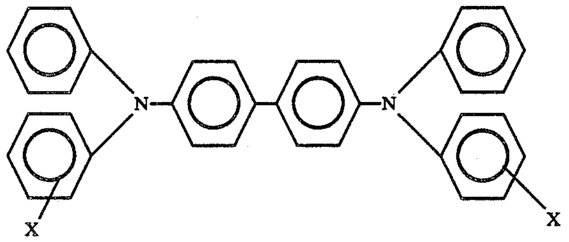

wherein X is selected from the group consisting of an alkyl group having from 1 to about 4 carbon atoms and chlorine.

9. An electrophotographic imaging member comprising a photoconductive member comprising a substrate, a titanium metal layer contiguous to said substrate, a blocking layer comprising a siloxane, said siloxane comprising a reaction product of a hydrolyzed silane having the structural formula

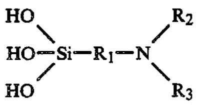

wherein $R_1$ is an alkylidene group containing 1 to 20 carbon atoms and $R_2$ and $R_3$ are independently selected from the group consisting of H, a lower alkyl group containing 1 to 3 carbon atoms, a phenyl group, a poly(ethylene)amino group and an ethylene diamine group, a charge generating binder layer and a charge transport layer comprising a resin binder and a diamine compound.

10. An electrophotographic imaging member according to claim 9 including a layer of an adhesive material interposed between said blocking layer and said charge generating binder layer.

11. An electrophotographic imaging member according to claim 10 wherein the thickness of said blocking layer is between about 20 Angstroms and about 2,000 Angstroms.

12. An electrophotographic imaging member according to claim 9 wherein the thickness of said titanium metal layer is between about 100 Angstrom units and about 750 Angstrom units.

13. An electrophotographic imaging member according to claim 9 wherein the thickness of said siloxane layer has a thickness of between about 20 Angstroms and about 2,000 Angstroms.

14. An electrophotographic imaging member according to claim 9 wherein said charge generating binder layer comprises particles of trigonal selenium.

15. An electrophotographic imaging member according to claim 9 wherein said charge generating binder layer is contiguous to a layer comprising a solid solution of a polycarbonate resin material and said diamine compound, said diamine compound being selected from the group consisting of one or more compounds having the general formula:

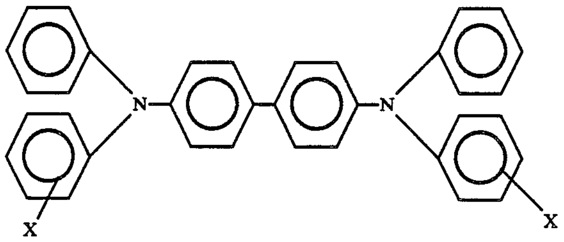

wherein X is selected from the group consisting of an alkyl group having from 1 to about 4 carbon atoms and chlorine.

16. An electrophotographic imaging member comprising a substrate, a titanium metal layer contiguous to said substrate, a blocking layer comprising a siloxane, said siloxane comprising a reaction product of a hydrolyzed silane having the structural formula

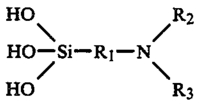

wherein $R_1$ is an alkylidene group containing 1 to 20 carbon atoms and $R_2$ and $R_3$ are independently selected from the group consisting of H, a lower alkyl group containing 1 to 3 carbon atoms, a phenyl group, a poly(ethylene)amino group and an ethylene diamine group, an adhesive layer comprising a film forming polymer, a charge generating binder layer comprising particles of amorphous selenium, trigonal selenium, and selenium alloys selected from the group consisting of selenium-telurium, selenium-telurium-arsenic and mixtures thereof dispersed in a binder of polyvinyl carbazole, and a layer comprising a solid solution of a polycarbonate resin mterial and a diamine compound, said diamine compound of one or more compounds having the general formula:

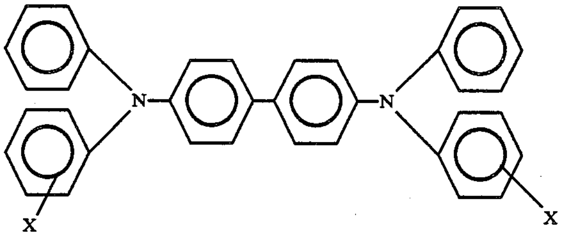

wherein X is selected from the group consisting of an alkyl group having from 1 to about 4 carbon atoms and chlorine.

* * * * *